(12) United States Patent
Su et al.

(10) Patent No.: US 11,923,870 B2
(45) Date of Patent: Mar. 5, 2024

(54) METHOD FOR CONSTRUCTING A FAULT TOLERANT ENCODE USING A QUANTUM COMPUTATIONAL MODEL

(71) Applicant: National Applied Research Laboratories, Hsinchu (TW)

(72) Inventors: Zheng-Yao Su, Hsinchu (TW); Ming-Chung Tsai, Hsinchu (TW)

(73) Assignee: National Applied Research Laboratories, Hsinchu (TW)

( * ) Notice: Subject to any disclaimer, the term of this patent is extended or adjusted under 35 U.S.C. 154(b) by 59 days.

(21) Appl. No.: 17/511,626

(22) Filed: Oct. 27, 2021

(65) Prior Publication Data
US 2022/0131558 A1  Apr. 28, 2022

Related U.S. Application Data

(60) Provisional application No. 63/105,999, filed on Oct. 27, 2020, provisional application No. 63/121,305, filed on Dec. 4, 2020.

(51) Int. Cl.
*H03M 13/00* (2006.01)
*G06N 10/00* (2022.01)
*H03M 13/15* (2006.01)

(52) U.S. Cl.
CPC .......... *H03M 13/157* (2013.01); *G06N 10/00* (2019.01)

(58) Field of Classification Search
None
See application file for complete search history.

(56) References Cited

U.S. PATENT DOCUMENTS 6,128,764 A * 10/2000 Gottesman ............. G06N 10/00
714/785
8,581,227 B2 * 11/2013 Freedman ............. H04L 9/0852
257/E29.071

(Continued)

*Primary Examiner* — Mujtaba M Chaudry
(74) *Attorney, Agent, or Firm* — Amin, Turocy & Watson, LLP

(57) ABSTRACT

A method for constructing an n-qubit fault tolerant encode for any k-qubit quantum gate M, in any given quantum code [n, k, C], comprising: choosing a number n–k of independent spinors $S_r$ from the first stabilizer C and a first ordered set $S_C$ consists of the independent spinors $S_r$; choosing a number n–k of independent spinors $\hat{S}_r$ from a second stabilizer $\hat{C}$ in the intrinsic coordinate and a second ordered set $\hat{S}_r$ consists of the independent spinors $\hat{S}_r$ consist; implementing an encoding $Q_{en}$, wherein the encoding $Q_{en}$ converts the first ordered set $S_C$ to the second ordered set $S_{\hat{C}}$, wherein the encoding $Q_{en}$ is a sequential product provided by sequential operations of a number n–k of unitary operators $Q_r$; wherein each of the unitary operator $Q_r$ is composed of a single s-rotation or a product of two s-rotations; and wherein the encoding $Q_{en}$ converts and maps the $r^{th}$ independent spinor $S_r$ in the first ordered set $S_C$ to the $r^{th}$ independent spinor $\hat{S}_r$ in the second ordered set $S_{\hat{C}}$ correspondingly; a fault tolerant action $\hat{U}$ in the quantum code [n, k, C] generated by the second stabilizer $\hat{C}$ in the intrinsic coordinate, wherein the fault tolerant action $\hat{U}$ is a direct sum of a basis state operator $\Lambda$ and a correction operator $\Omega$; and acquiring a fault tolerant encode in the quantum code [n, k, C] generated by the first stabilizer C, wherein the fault tolerant encode is a sequential product of the encoding $Q_{en}$, the fault tolerant action $\hat{U}$ and a complex conjugate $Q_{en}^\dagger$ of the encoding $Q_{en}$.

7 Claims, 5 Drawing Sheets

(56) References Cited

U.S. PATENT DOCUMENTS

| | | | |
|---|---|---|---|
| 8,987,703 B2* | 3/2015 | Willett | H10N 52/101 |
| | | | 257/14 |
| 9,040,959 B2* | 5/2015 | Lutchyn | H10N 60/128 |
| | | | 257/31 |
| 11,451,231 B2* | 9/2022 | Jiang | G06N 10/40 |
| 2018/0341874 A1* | 11/2018 | Puri | H03F 19/00 |
| 2020/0050959 A1* | 2/2020 | Ashrafi | H04L 9/0852 |
| 2020/0118026 A1* | 4/2020 | Ashrafi | G06N 10/00 |
| 2021/0126652 A1* | 4/2021 | Delfosse | G06N 5/01 |
| 2021/0133614 A1* | 5/2021 | Ashrafi | G06N 10/00 |

* cited by examiner

US 11,923,870 B2

METHOD FOR CONSTRUCTING A FAULT TOLERANT ENCODE USING A QUANTUM COMPUTATIONAL MODEL

RELATED APPLICATIONS

The present application claims the priority of U.S. Provisional Patent Application No. 63/105,999, filed on Oct. 27, 2020, and U.S. Provisional Patent Application No. 63/121,305, filed on Dec. 4, 2020, the disclosures of both of which are hereby incorporated by reference herein in its entirety.

BACKGROUND OF THE INVENTION

1. Field of the Invention

The present disclosure generally relates to a method for constructing an n-qubit fault tolerant encode, particularly, to a method for constructing an n-qubit fault tolerant encode for any k-qubit quantum gate, M, in any given quantum code [n, k, C].

2. Description of the Related Art

Quantum computers is theoretically proven to have greater computational power than their classical counterparts. However, the realization of this superiority at hardware level relies heavily on the capability to perform large-scale computations in an error-prone environment. Fault tolerance computation is a crucial role in scalable quantum computing. In current attempts of realizing fault tolerance quantum computation, transversal encodes of a restricted universal set of gates in limited codes are the main focus; however, this induces a substantial overhead.

Therefore, it is an urgent problem to be solved in this industry that how to provide a method enabling to realize fault tolerance computation in scalable quantum computing.

SUMMARY OF THE INVENTION

In light of solving the foregoing problems of the prior art, the present inventive concept provides a method for constructing an n-qubit fault tolerant encode for any k-qubit quantum gate M in any given quantum code [n, k, C], wherein the C is defined as a k-th maximal bi-subalgebra; the quantum code [n, k, C], a Quotient Algebra Partition (QAP), is consisting of a number $2^{n+k}$ of cosets of the first stabilizer C; the cosets of the first stabilizer C is able to group into a number $2^{n-k}$ of blocks $\Gamma_\alpha$, wherein each of the blocks $\Gamma_\alpha$ consists of $2^{2k}$ cosets of the first stabilizer C with same syndrome $\alpha$; and the quantum code [n, k, C] is used for detecting and correcting chosen errors from different blocks $\Gamma_\alpha$, and the errors are collected as an error set $\varepsilon$.

The method of the present inventive concept comprises:
(1) choosing a number of n−k of independent spinors $S_r$ from the first stabilizer C and a first ordered set $S_C$ consists of the independent spinors $S_r$;
(2) choosing a number of n−k of independent spinors $\hat{S}_r$ in a second stabilizer $\hat{C}$, the one in the intrinsic coordinate, and a second ordered set $S_{\hat{C}}$ consists of the independent spinors $\hat{S}_r$ in the intrinsic coordinate;
(3) implementing an encoding $Q_{en}$, wherein the encoding $Q_{en}$ converts the first ordered set $S_c$ to the second ordered set $S_{\hat{C}}$, and transforms the first stabilizer C to the second stabilizer $\hat{C}$ in the intrinsic coordinate, wherein the code [n, k, C] is converted to [n, k, $\hat{C}$] in the intrinsic coordinate; wherein the encoding $Q_{en}$ is a sequential product provided by sequential operations of a number n−k of unitary operators $Q_r$; wherein each of the unitary operator $Q_r$ is composed of a single s-rotation or a product of two s-rotations; and wherein the encoding $Q_{en}$ converts and maps the $r^{th}$ independent spinor $S_r$ in the first ordered set $S_C$ to the $r^{th}$ independent spinor $\hat{S}_r$ in the second ordered set $S_{\hat{C}}$ correspondingly;
(4) a fault tolerant action $\hat{U}$ in the quantum code [n, k, C] generated by the second stabilizer $\hat{C}$ in the intrinsic coordinate, wherein the fault tolerant action $\hat{U}$ is a direct sum of a basis state operator $\Lambda$ and a correction operator $\Omega$; and
(5) acquiring a fault tolerant encode in the quantum code [n, k, C] generated by the first stabilizer C, wherein the fault tolerant encode is a sequential product of the encoding $Q_{en}$, the fault tolerant action $\hat{U}$ and a complex conjugate $Q_{en}^\dagger$ of the encoding $Q_{en}$. The fault tolerant encode obeys two criteria, wherein one of the criteria is eigen-invariance that every codeword state is still a codeword after applying the encode, and the other one of the criteria is error-correctable that each corrupted state is a linear superposition of correctable states in [n, k, C] after applying the encode.

In an embodiment of the present inventive concept, the first stabilizer C is composed of $2^{n-k}$ n-qubit spinors, wherein the n-qubit spinors are able to commute with each other.

In an embodiment of the present inventive concept, the basis state operator $\Lambda$ is composed of a direct product by a single basis state projection operator and a k-qubit quantum gate M.

In an embodiment of the present inventive concept, the correction operator $\Omega$ is composed of $2^{\{2(n-k)\}}$ submatrices $M_{\alpha\beta}$.

In an embodiment of the present inventive concept, the correction operator $\Omega$ is obtained by a method, including:
transforming each correctable error $E_\tau$ of a correctable error set $\varepsilon$ by the encoding $Q_{en}$ to a coset of error of each correctable error $E_\tau$ in the second stabilizer $\hat{C}$ in the intrinsic coordinate, wherein the coset of error is a k-qubit spinor $\mathbb{S}_\tau$;
building a first complete set $P_{in}$ in the second stabilizer $\hat{C}$ in the intrinsic coordinate, wherein the first complete set $P_{in}$ is consisting of a unique input coset $\mathbb{S}_\beta$ solely chosen from every block $\Gamma_\alpha$, and the first complete set $P_{in}$ contains all the spinors $\mathbb{S}_\tau$;
building a second complete set $P_{out}$ in the second stabilizer $\hat{C}$ in the intrinsic coordinate, wherein the second complete set $P_{out}$ is consisting of a unique output coset $\mathbb{S}_\alpha$ solely chosen from every block $\Gamma_\alpha$;
formulating a transfer amplitude T; and
wherein each of the submatrices $M_{\alpha\beta}$ of the encoding $Q_{en}$ represents as a sequential product by entries of the submatrices $M_{\alpha\beta}$ ($x_{\alpha\beta}$), the output coset $\mathbb{S}_\alpha$, the k-qubit quantum gate M and the input coset $\mathbb{S}_\beta$.

In an embodiment of the present inventive concept, wherein the transfer amplitude T is a $2^n \times 2^n$ unitary matrix.

In an embodiment of the present inventive concept, the entries $x_{\alpha\beta}$ of the unitary matrix fulfills a relation which is $x_{0\beta} = x_{\alpha 0} = 0$.

Compared to the conventional prior art, the present inventive concept allows fault tolerant encodes of an arbitrary action in every error-correcting code, which differs from existing approaches of building encodes for a very few actions in very limited choices of quantum codes. Specifically, fault tolerant encodes of an arbitrary k-qubit action can be constructed in every quantum code [n, k, C] of length n k with the stabilizer C, an algebraic structure consisting of commuting error-detection operators.

DETAILED DESCRIPTION

The present inventive concept is described by the following specific embodiments. Those with ordinary skills in the arts can readily understand other advantages and functions of the present inventive concept after reading the disclosure of this specification. Any changes or adjustments made to their relative relationships, without modifying the substantial technical contents, are also to be construed as within the range implementable by the present inventive concept.

Moreover, the word "exemplary" or "embodiment" is used herein to mean serving as an example, instance, or illustration. Any aspect or design described herein as exemplary or an embodiment is not necessarily to be construed as preferred or advantageous over other aspects or designs. Rather, use of the word "exemplary" or "embodiment" is intended to present concepts and techniques in a concrete fashion.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

Furthermore, as used in this application, the term "first" or "second" is meant to distinguish the objects in different coordinates, e.g., the second stabilizer, $\hat{C}$, as a stabilizer in the intrinsic coordinate, and is not meant to limit the scope of the invention in any way.

Figure 1:
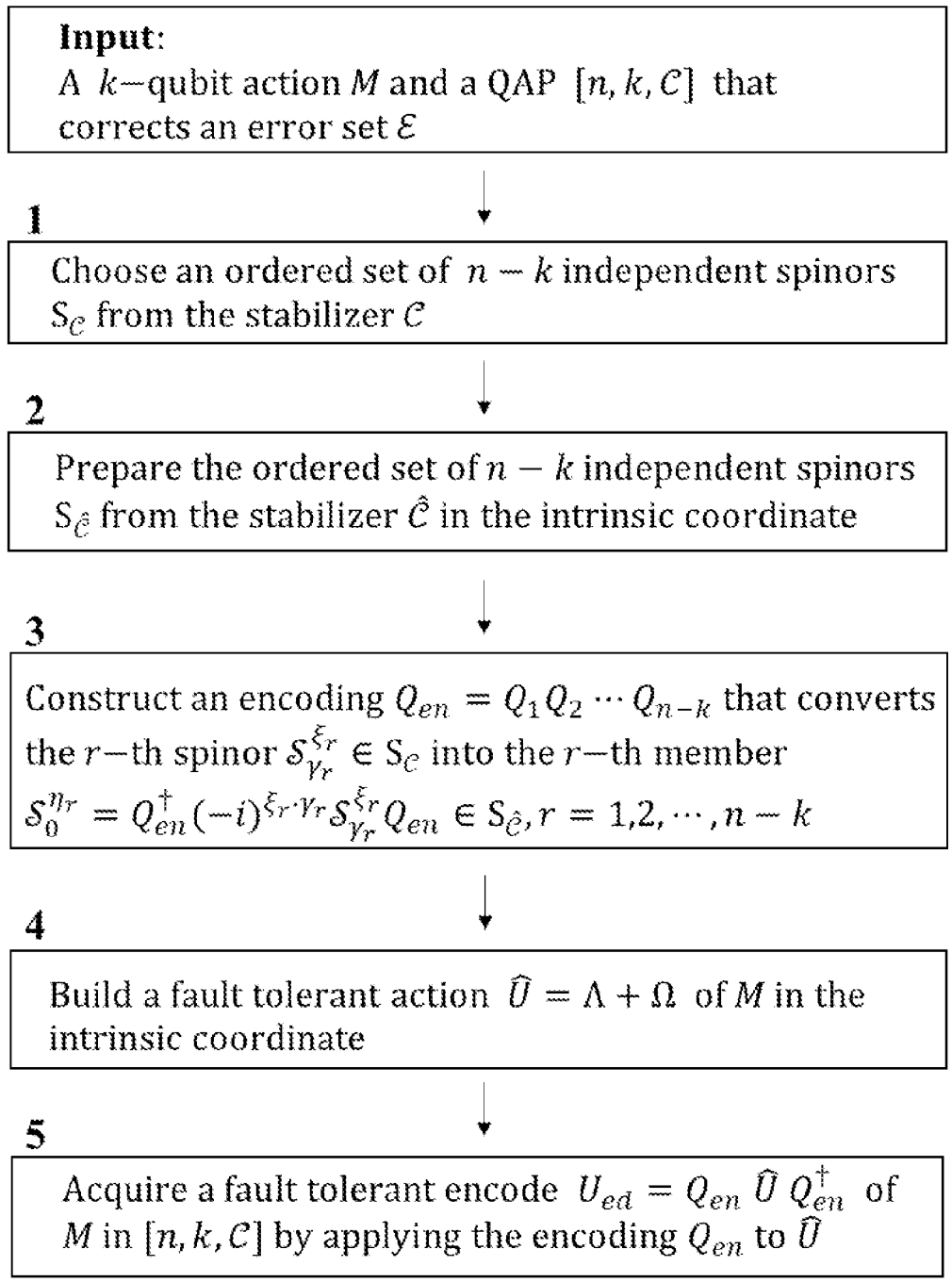
FIG. 1 is a diagrammatic illustration according to the present inventive concept.
Figure 1:
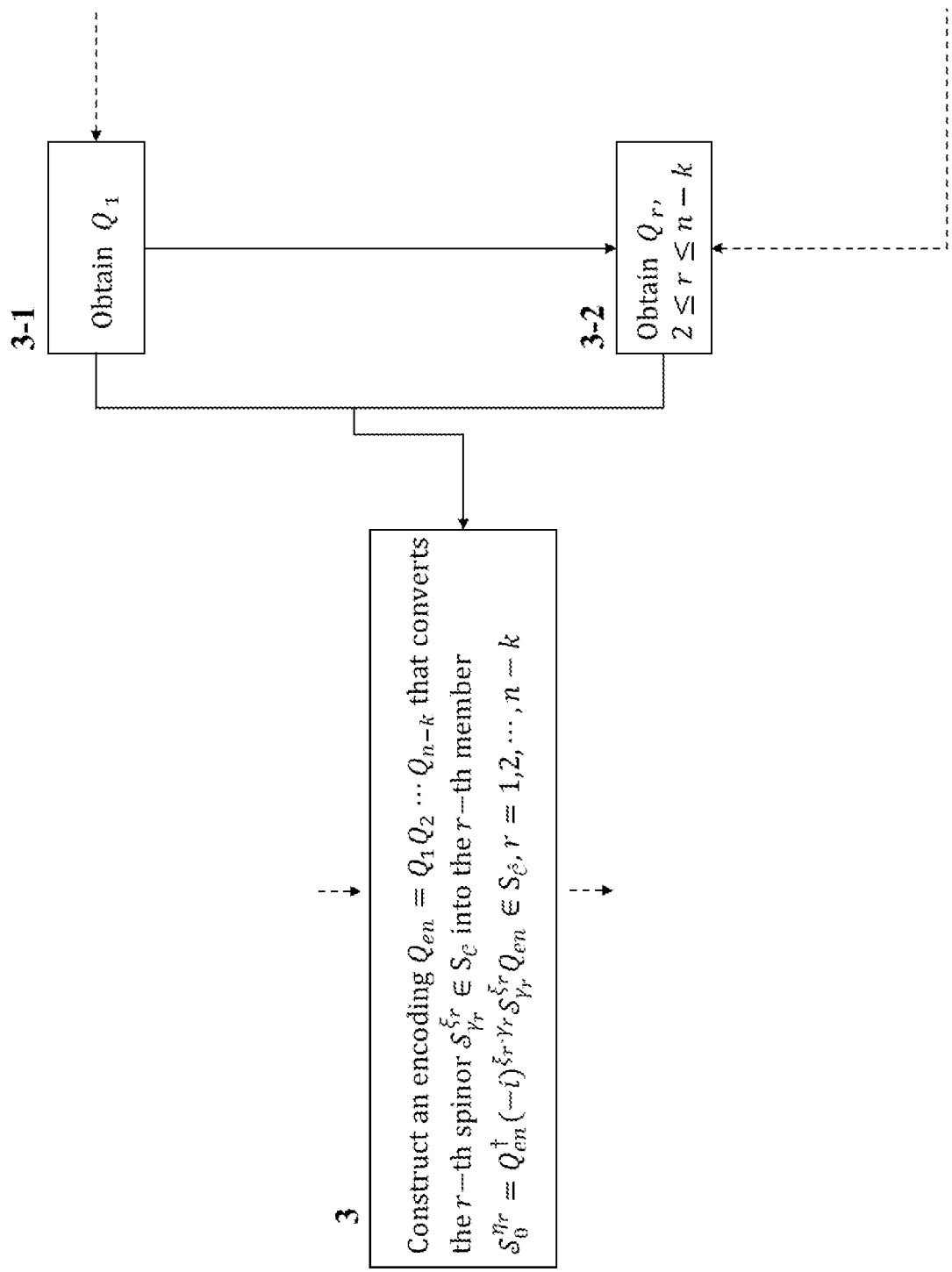
Figure 1:
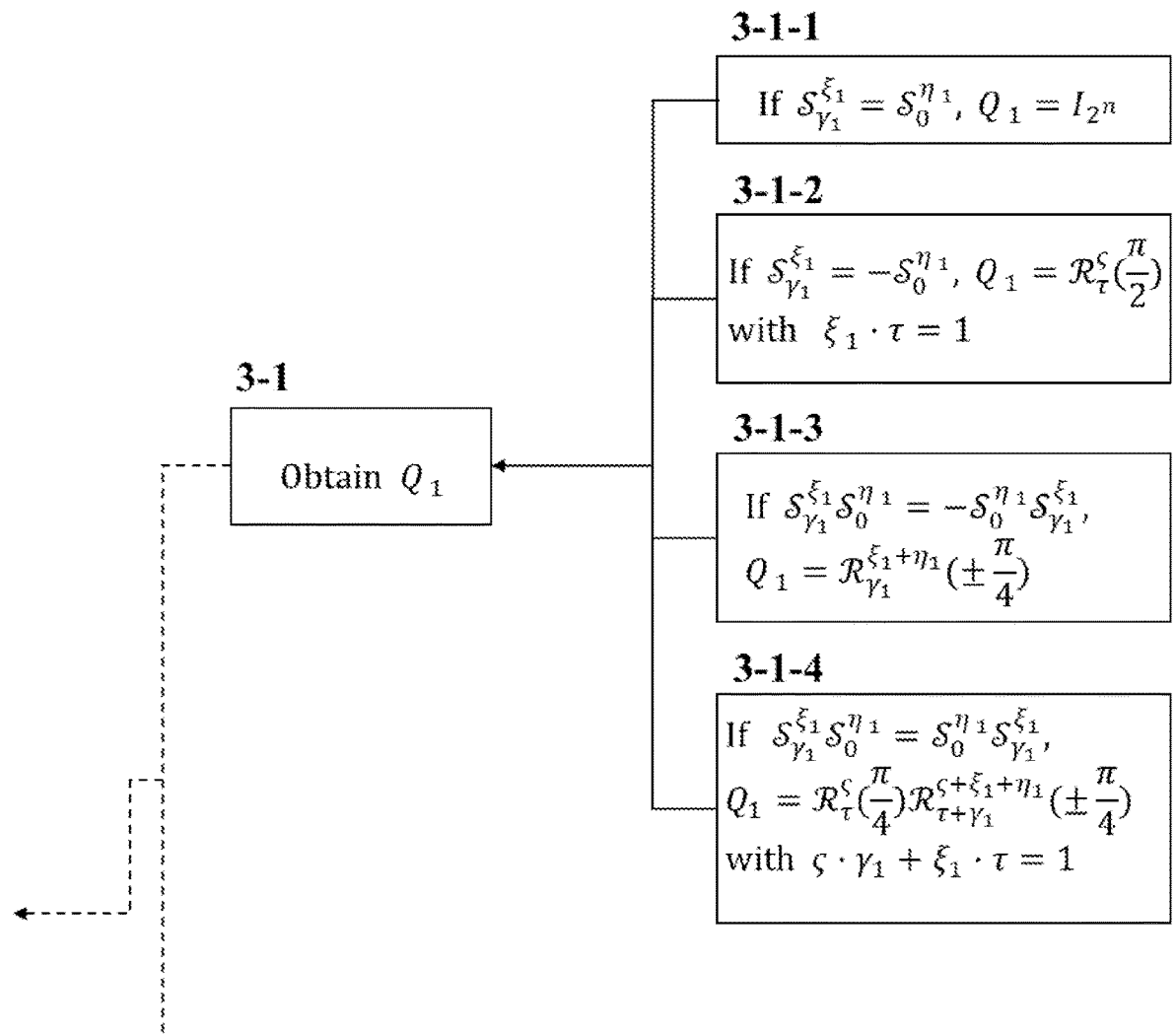
Figure 1:
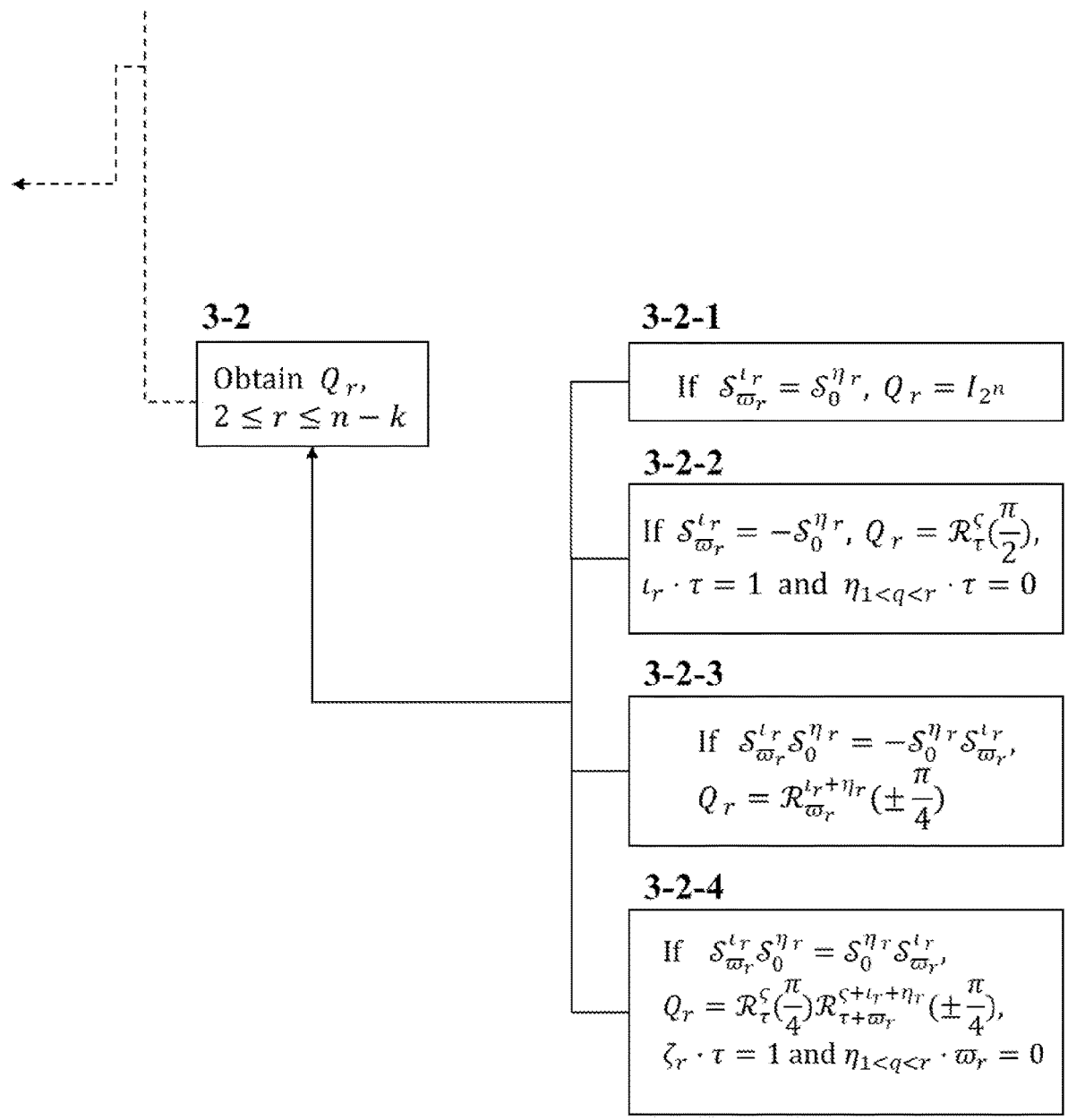
Figure 1:
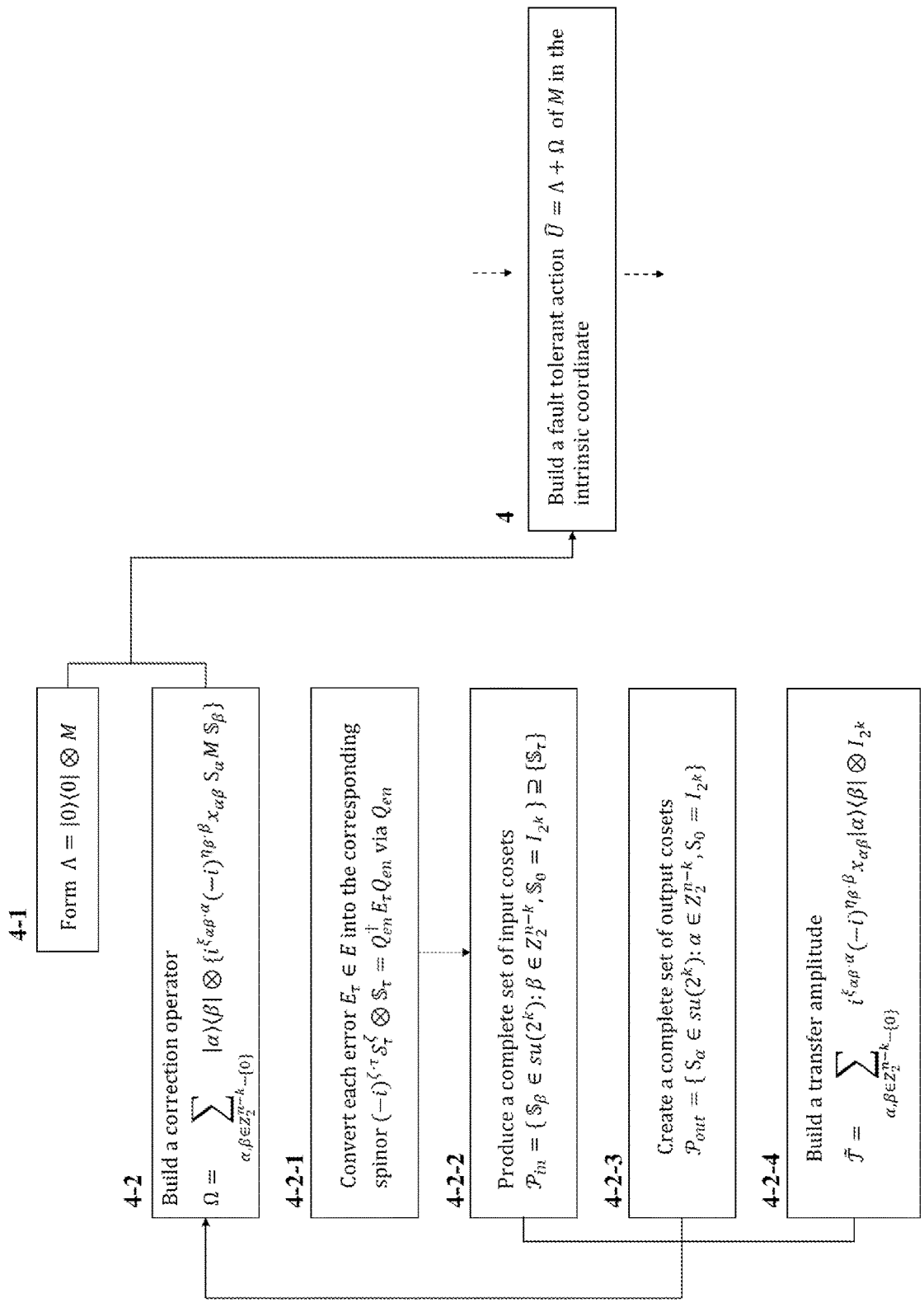

Please refer to FIG. 1. The present inventive concept provides a method for constructing an n-qubit fault tolerant encode for any k-qubit quantum gate M in any given quantum code [n, k, C], wherein the C is defined as a first stabilizer; the quantum code [n, k, C] is consisting of a number $2^{n+k}$ of cosets of the first stabilizer C; the cosets of the first stabilizer C is able to group into a number $2^{n+k}$ of blocks $\Gamma_\alpha$, wherein each of the blocks $\Gamma_\alpha$ consists of $2^{2k}$ cosets of the first stabilizer C with same syndrome α; and the quantum code [n, k, C] is used for detecting and correcting chosen errors from different blocks $\Gamma_\alpha$, and the errors are collected as an error set ε.

The method of the present inventive concept comprises:

(1) choosing a number of n-k of independent spinors from the first stabilizer C and a first ordered set $S_C$ consists of the independent spinors $S_r$;

In the embodiment, the first ordered set $S_C$ is given as follows.

$$S_C = \{S_{\alpha_r}: r=1, 2, \ldots, n-k\} \quad \text{(Eq. 1)}$$

is chosen from the first stabilizer $C \subset su(2^n)$, which is the seed to generate the structure of quotient algebra partition (QAP) inherited by the quantum code [n, k, C]. The syndrome of a spinor $S_\beta^{\eta} \in su(2^n)$ with respect to $S_C$ is an (n-k)-digit binary string $\tau = \in_1 \in_2 \ldots \in_{n-k}$ orderly concatenated by the parties $\in_r = \eta \cdot \alpha_r + \zeta_r \cdot \beta \in Z_2$.

In the present inventive concept, the first stabilizer C of a first stabilizer code [n, k, C] is a k-th maximal bi-subalgebra of a Cartan subalgebra $\mathfrak{C} \subset su(2^n)$, and a k-th maximal bi-subalgebra $\mathfrak{B}^{[k]}$ of $\mathfrak{C}$ corresponds to the stabilizer of the first stabilizer code [n, k, C].

In the present inventive concept, the stabilizer quantum code denoted as [n, k, C]={$\mathcal{P}_Q(C)$} is a Quotient Algebra Partition (QAP) generated by a k-th maximal bi-subalgebra C of a Cartan subalgebra in $su(2^n)$.

The independence among spinors is referred to as being independent under the bi-addition. When the syndrome of a spinor is addressed, an ordered set $S_C$ of detection operators is assumed. By tagging the feature of syndrome on each spinor in a partition, a refined version of closure emerges.

In the present inventive concept, an ordered set of a number n-k of independent spinors $S_C = \{S_r: r=1, 2, \ldots, n-k\}$ are given, which is from a k-th maximal bi-subalgebra C of a Cartan subalgebra in $su(2^n)$, the space of n-qubit states admits a decomposition $\mathcal{H} = \oplus_{\tau \in Z_2^{n-k}} \mathcal{H}_\tau$, where each $\mathcal{H}_\tau$, formed by states $|\psi\rangle$ satisfying $S_r|\psi\rangle = (-1)^{\in_r}|\psi\rangle$, is an eigen-invariant subspace of C with the syndrome $\tau = \in_1 \in_2 \ldots \in_{n-k}$, $\in_r \in Z_2$, and also an invariant subspace of the seed block $\Gamma_0$, i.e., $\Gamma_0(\mathcal{H}_\tau) \subset \mathcal{H}_\tau$; moreover, the duality $\Gamma_\nu(\mathcal{H}_\tau) \subset \mathcal{H}_{\tau+\nu}$ holds for every block $\Gamma_\nu$ and subspace $\mathcal{H}_\tau$, $\nu \in Z_2^{n-k}$.

In a partition [n, k, C], the orthogonality condition $$\langle \psi_{0,j}|S_{u,\nu}S_{\tau,\mu}|\psi_{0,i}\rangle = \chi \delta_{\nu\tau} \delta_{ji} \quad \text{(Eq. 2)}$$

holds for basis codewords $|\psi_{0,i}\rangle$ and $|\Psi_{0,j}\rangle$, and two spinors $S_{\tau,\mu} \in \mathcal{W}_{\tau,\mu}$ and $S_{u,\nu} \in \mathcal{W}_{u,\nu}$ either in distinct blocks $\Gamma_\tau$ and $\Gamma_\nu$, $\tau \neq \nu$, or in a same coset $\mathcal{W}_{\tau=\nu,\mu=\nu}$ of block $\Gamma_{\tau=\nu}$ with $\chi = \pm 1$ or $\pm i$, $\tau, \nu \in Z_2^{n-k}$, $\mu, \nu \in Z_2^{2k}$ and $i,j \in Z_2^k$.

In a partition [n, k, C], the concept a spinor is a coset spinor conveys two implications, the correction equivalence that an error is correctable by any member in a same coset, and the code degeneracy that a correctable error set allows spinors in a same coset. (2) choosing a number of n-k of independent spinors $\hat{S}_r$ in a second stabilizer $\hat{C}$ in the intrinsic coordinate $\hat{C}$ and a second ordered set $S_{\hat{C}}$ consists of the second independent spinors $\hat{S}_r$ in the intrinsic coordinate;

In the present inventive concept, the second ordered set $S_{\hat{C}}$ $$S_{\hat{C}} = \{S_0^{\eta_r} \in su(2^n): \eta_r = \zeta_r \circ 0 \in Z_2^n, \zeta_r \in Z_2^{n-k}, 1 \leq r \leq n-k\}$$

is prepared from the intrinsic coordinate $\hat{C}$ in the intrinsic coordinate.

In the present inventive concept, to prepare fault tolerant encodes in a partition, a special coordinate is required.

The intrinsic Cartan subalgebra $$\mathfrak{C}_{[0]} = \{\mathcal{S}_0^\xi: \xi \in Z_2^n\} \quad \text{(Eq. 3)}$$

is a maximal abelain subalgebra of $su(2^n)$ composed of diagonal spinors of n qubits. The set of phase strings $\{\xi\}$ from $\mathfrak{C}_{[0]}$ assembles the group $Z_2^n$ under the bitwise addition.

A bi-subalgebra $C = \{\mathcal{S}_0^\xi\}$ is a diagonal bi-subalgebra of the k-th maximum of the intrinsic Cartan subalgebra $\mathfrak{C}_{[0]} \subset su(2^n)$ if the phase strings $\{\xi\}$ of spinors in C form a k-th maximal subgroup of $Z_2^n$, k=0, 1, . . . , n.

The intrinsic bi-subalgebra of the k-th maximum $$\hat{C} = \{\mathcal{S}_0^\zeta \oplus \mathcal{S}_0^0: \zeta \in Z_2^{n-k}\} \quad \text{(Eq. 4)},$$

of the intrinsic Cartan subalgebra $\mathfrak{C}_{[0]} \subset su(2^n)$, has the eigenstates $|\tau\rangle \oplus |i\rangle$ that form the intrinsic coordinate, $\tau \in Z_2^{n-k}$ and $i \in Z_2^{n-k}$ i, here $\mathcal{S}_0^\zeta$ being a diagonal spinor of $su(2^{n-k})$ and $\mathcal{S}_0^0$ the identity of $su(2^k)$.

Given an ordered set of a number n–k of independent spinors $\hat{S}_{\hat{C}} = \{\mathcal{S}_0^{\zeta_r} \oplus \mathcal{S}_0^0 : \zeta_r = \sigma_{r,1}\sigma_{r,2} \ldots \sigma_{r,n-k} \in Z_2^{n-k}$ and $\sigma_{ru} = \delta_{ru}, r, u=1, 2, \ldots, n-k\}$ in $\hat{C}$, the space of n-qubit states admits a decomposition $\mathcal{H} = \bigoplus_{\tau \in Z_2^{n-k}} \mathcal{H}_\tau$ of disjoint eigen-invariant subspaces of the intrinsic bi-subalgebra $\hat{C}$, where each $\mathcal{H}_\tau$ of syndrome $\tau$ is spanned by the orthonormal basis $\{|\tau\rangle \oplus |i\rangle : i \in Z_2^k\}$ of dimension $2^k$.

(3) implementing an encoding $Q_{en}$, wherein the encoding $Q_{en}$ converts the first ordered set $S_C$ to the second ordered set $S_{\hat{C}}$, and transforms the first stabilizer C to the second stabilizer $\hat{C}$ in the intrinsic coordinate, wherein the code [n, k, C] is converted to [n, k, $\hat{C}$] in the intrinsic coordinate; wherein the encoding $Q_{en} = Q_1 Q_2 \ldots Q_{n-k}$ is a sequential product provided by sequential operations of a number n–k of unitary operators $Q_r$; wherein each of the unitary operator $Q_r$ is composed of a single s-rotation or a product of two s-rotations; and wherein the encoding $Q_{en}$ converts and maps the $r^{th}$ independent spinor $S_r$ in the first ordered set $S_C$ to the $r^{th}$ independent spinor $\hat{S}_r$ in the second ordered set $S_{\hat{C}}$ correspondingly;

In the present inventive concept, transforming the partition [n, k, $\hat{C}$] into [n, k, C] is achievable by an encoding $Q_{en} \in SU(2^n)$ that converts the intrinsic bi-subalgebra $\hat{C}$ to $C = Q_{en} \hat{C} Q_{en}^\dagger$.

An s-rotation $\mathcal{R}_\alpha^\zeta(\theta) = e^{i\theta(-i)^{\zeta \cdot \alpha} \mathcal{S}_\alpha^\zeta} \in SU(2^n)$ of a spinor $(-i)^{\zeta \cdot \alpha} \mathcal{S}_\alpha^\zeta$ has the expression $$e^{i\theta(-i)^{\zeta \cdot \alpha} \mathcal{S}_\alpha^\zeta} = \cos\theta \, \mathcal{S}_0^0 + i\sin\theta \, (-i)^{\zeta \cdot \alpha} \mathcal{S}_\alpha^\zeta \quad \text{(Eq. 5)}$$

with the identity $\mathcal{S}_0^0 \in su(2^n)$, $0 \leq \theta < 2\pi$.

An s-rotation $\mathcal{R}_\alpha^\zeta(\theta) \in SU(2^n)$ is a spinor-to-spinor mapping as $$\theta = \pm\frac{\pi}{2}, \pm\frac{\pi}{4}.$$

In the present inventive concept, the r-th spinor $\mathcal{S}_{\gamma_r}^{\zeta_r}$ of $S_C$ is converted into the r-th member $\mathcal{S}_0^{\eta_r} = Q_{en}^\dagger \mathcal{S}_{\gamma_r}^{\zeta_r} Q_{en}$ of the second ordered set $S_{\hat{C}}$.

(3-1) Acquisition of $Q_1$ (subroutine A):

(3-1-1)

If $\mathcal{S}_{\gamma_1}^{\xi_1} = \mathcal{S}_0^{\eta_1}, Q_1 = I_{2^n}$; (Eq. 6)

(3-1-2)

If $\mathcal{S}_{\gamma_1}^{\xi_1} = -\mathcal{S}_0^{\eta_1}, Q_1 = \mathcal{R}_\tau^\varsigma\left(\frac{\pi}{2}\right)$ with $\xi_1 \cdot \tau = 1$; (Eq. 7)

(3-1-3)

If $\mathcal{S}_{\gamma_1}^{\xi_1} \mathcal{S}_0^{\eta_1} = -\mathcal{S}_0^{\eta_1} \mathcal{S}_{\gamma_1}^{\xi_1}, Q_1 = \mathcal{R}_{\gamma_1}^{\xi_1 + \eta_1}\left(\pm\frac{\pi}{2}\right);$ (Eq. 8)

(3-1-4)

If $\mathcal{S}_{\gamma_1}^{\xi_1} \mathcal{S}_0^{\eta_1} = \mathcal{S}_0^{\eta_1} \mathcal{S}_{\gamma_1}^{\xi_1}, Q_1 = \mathcal{R}_\tau^\varsigma\left(\frac{\pi}{4}\right) \mathcal{R}_{\tau+\gamma_1}^{\varsigma+\xi_1+\eta_1}\left(\pm\frac{\pi}{4}\right)$ with (Eq. 9)

$\varsigma \cdot \gamma_1 + \xi_1 \cdot \tau = 1$ and $\eta_1 \cdot \tau = 1$ (3-2) Construction of $Q_r$, $2 \leq r \leq n-k$ (subroutine B):

suppose that the first r–1 operations $Q_1, Q_2, \ldots, Q_{r-1}$ are created, noting $\pm \mathcal{S}_{\varpi_r}^{\iota_r} = Q_{r-1}^\dagger \ldots Q_2^\dagger Q_1^\dagger \mathcal{S}_{\gamma_r}^{\xi_r} Q_1 Q_2 \ldots Q_{r-1}$ and $$\mathcal{S}_0^{\eta_q} = Q_{r-1}^\dagger \ldots Q_2^\dagger Q_1^\dagger \mathcal{S}_{\gamma_q}^{\xi_q} Q_1 Q_2 \ldots Q_{r-1}, 1 \leq q \leq r-1; \quad \text{(Eq. 10)}$$

(3-2-1)

If $\mathcal{S}_{\varpi_r}^{\iota_r} = \mathcal{S}_0^{\eta_r}, Q_r = I_{2^n}$; (Eq. 11)

(3-2-2)

If $\mathcal{S} \mathcal{S}_{\varpi_r}^{\iota_r} = -\mathcal{S}_0^{\eta_r}, Q_r = \mathcal{R}_\tau^\varsigma\left(\frac{\pi}{2}\right)$ with $\iota_r \cdot \tau = 1$ and (Eq. 12)

$\eta_q \cdot \tau = 0$ $1 \leq q \leq r-1$ (3-2-3)

If $\mathcal{S}_{\varpi_r}^{\iota_r} \mathcal{S}_0^{\eta_r} = -\mathcal{S}_0^{\eta_r} \mathcal{S}_{\varpi_r}^{\iota_r}, Q_r = \mathcal{R}_{\varpi_r}^{\iota_r + \eta_r}\left(\pm\frac{\pi}{4}\right)$ (Eq. 13)

(3-2-4)

If $\mathcal{S}_{\varpi_r}^{\iota_r} \mathcal{S}_0^{\eta_r} = \mathcal{S}_0^{\eta_r} \mathcal{S}_{\varpi_r}^{\iota_r}, Q_r = \mathcal{R}_\tau^\varsigma\left(\frac{\pi}{4}\right) \mathcal{R}_{\tau+\varpi_r}^{\varsigma+\iota_r+\eta_r}\left(\pm\frac{\pi}{4}\right)$ with (Eq. 14)

$\varsigma \cdot \varpi_r + \iota_r \cdot \tau = 1$ and $\eta_q \cdot \tau = 0$, $1 \leq q \leq r-1$;

(4) a fault tolerant action $\hat{U}$ in the quantum code [n, k, C] generated by the second stabilizer $\hat{C}$ in the intrinsic coordinate, wherein the fault tolerant action $\hat{U}$ is a direct sum of a basis state operator $\Lambda$ and a correction operator $\Omega$;

The formulation of fault tolerant encodes is guided by two criteria.

For the partition [n, k, C] generated by a bi-subalgebra $C \subset su(2^n)$, an action $U \in SU(2^n)$ is fault tolerant by fulfilling two criteria, the eigen-invariance, i.e., $SU|\psi\rangle = U|\psi\rangle$ for each spinor $S \in C$ and every codeword $|\tilde{S}\rangle$, and the error correction against an error set $\varepsilon$, i.e., $US_\beta|\psi\rangle = \Sigma_{\alpha \in Z_2^{n-k} - \{0\}} x_{\alpha\beta} S_{\alpha,\nu} U|\psi\rangle$ for $S_\beta \in \varepsilon$ with $S_{\alpha,\nu}$ in a coset $\mathcal{W}_{\alpha,\nu}$ uniquely from each block $\Gamma_{\alpha,\nu} \in Z_2^{2k}$ and $x_{\alpha\beta} \in \mathbb{C}$.

The criterion of eigen-invariance obliges $U|\psi\rangle$ to stay as a codeword of C, to which the partition [n, k, C] is applicable. The 2nd criterion is to pledge every error of $\varepsilon$ correctable by [n, k, C], a corruption $US_\beta|\psi\rangle$ affected by an error $S_\beta \in \varepsilon$ admits a linear expansion in correctable states $S_{\alpha,\nu} U|\psi\rangle$, here $S_{\alpha,\nu}$ being an arbitrary spinor from a single coset $\mathcal{W}_{\alpha,\nu}$ in $\Gamma_\alpha$. The derivation is conducted in the intrinsic coordinate.

In this embodiment, an error set $\varepsilon$ is correctable by a partition [n, k, C] iff two arbitrary spinors of $\varepsilon$ are either in different blocks or in a same coset of a block within this partition.

In the partition [n, k, $\hat{C}$] generated by the intrinsic bi-subalgebra $\hat{C}$, an eigen-invariant action $\hat{U} \in SU(2^n)$ takes the block-diagonal form $$\hat{U} = \Lambda + \Omega \quad \text{(Eq. 15)}$$

with $\Lambda = |0\rangle\langle 0| \oplus M_{0,0}$, $M_{0,0} \in SU(2^k)$, $\Omega = \Sigma_{\alpha,\beta \in Z_2^{n-k} - [9]} |\alpha\rangle\langle\beta| \oplus M_{\alpha,\beta}$, $M_{\alpha,\beta} \in \mathbb{C}^{2^k \times 2^k}$, and $|0\rangle$, $|\alpha\rangle$ and $|\beta\rangle$ being respectively a basis state of n–k qubits.

In the present inventive concept, the correction operator $\Omega = \Sigma_{\alpha,\beta \in Z_2^{n-k}} |\alpha\rangle\langle\beta| \oplus \{i^{\xi_{\alpha\beta} \cdot \alpha}(-i)^{\eta_\beta \cdot \beta} x_{\alpha\beta} S_\alpha M \tilde{S}_\beta\}$ through the following steps (subroutine C):

(4-2-1) Convert each error $E_r$ of $\varepsilon$ into the corresponding spinor
$(-i)^{\xi \cdot \tau} \mathbb{S}_r^{\zeta} \oplus \mathbb{S}_\tau = Q_{en}^\dagger E_\tau Q_{en}$ via the encoding $Q_{en}$;

(4-2-2) produce a complete set of input cosets
$\mathcal{P}_{in} = \{\mathbb{S}_\beta \in su(2^k): \beta \in \mathbb{Z}_2^{n-k}, \mathbb{S}_0 = I_{2^k}\}$ consisting of cosets uniquely from each block $\Gamma_\beta$ and containing all cosets of errors $\mathbb{S}_r$;

(4-2-3) create a complete set of output cosets
$\mathcal{P}_{out} = \{S_\alpha \in su(2^k): \alpha \in \mathbb{Z}_2^{n-k}, \mathbb{S}_0 = I_{2^k}\}$ consisting of cosets uniquely from each block $\Gamma_\alpha$;

(4-2-4) Build a transfer amplitude $\tilde{\mathcal{T}} = \Sigma_{\alpha,\beta \in \mathbb{Z}_2^{n-k} - [0]} i^{\xi_{\alpha\beta} \cdot \alpha}$
$(-i)^{\eta_\beta \cdot \beta} x_{\alpha\beta} |\alpha\rangle \langle \beta| \oplus I_{2^k}$ following the unitarities $\tilde{\mathcal{T}} \tilde{\mathcal{T}}^\dagger = I_{2^n - 2^k}$
and $\tilde{\mathcal{T}}^\dagger \tilde{\mathcal{T}} = I_{2^n - 2^k}$.

(5) acquiring a fault tolerant encode in the quantum code $[n, k, C]$ generated by the first stabilizer $C$, wherein the fault tolerant encode is a sequential product of the encoding $Q_{en}$, the fault tolerant action $\hat{U}$ and a complex conjugate $Q_{en}^\dagger$ of the encoding $Q_{en}$.

Given a mapping $$M_{0,0} |i\rangle = \Sigma_{j \in \mathbb{Z}_2^k} a_{ji} |j\rangle \qquad \text{(Eq. 16)}$$

of an operation $M_{0,0} \in SU(2^k)$ acting on a basis state $|i\rangle$ of k qubits, the same form $$U|\tilde{i}\rangle = \Sigma_{j \in \mathbb{Z}_2^k} a_{ji} |\tilde{j}\rangle \qquad \text{(Eq. 17)}$$

holds for the operation $U = Q \hat{U} Q^\dagger$ acting on the basis state $|\tilde{i}\rangle = Q|0\rangle \oplus 0 |i\rangle$ of n qubits via a unitary transformation $Q \in SU(2^n)$, here $|\tilde{j}\rangle = Q|0\rangle \oplus |j\rangle$ and $\hat{U} = \Lambda + \Omega \in SU(2^n)$ being block diagonal, $\Lambda = |0\rangle\langle 0| \oplus M_{0,0}$, $\Omega = \Sigma_{\alpha,\beta \neq 0} |\alpha\rangle \langle \beta| \oplus M_{\alpha,\beta}$, $M_{\alpha,\beta} \in \mathbb{C}^{2^k \times 2^k}$, and $|0\rangle$, $|\alpha\rangle$ and $|\beta\rangle$ being a basis state of n–k qubits.

Suppose that an encoded state $|\psi_{ed}\rangle = Q_{en}|0\rangle \oplus |\psi\rangle$ is corrupted by a noise $E_{in} = \Sigma_\tau y_\tau E_\tau$, $\Sigma_\tau |y_\tau|^2 = 1$. The fault tolerance of $U_{ed}$ obtained by the algorithm is confirmed through the following examination.

$$U_{ed} E_{in} |\psi_{ed}\rangle = U_{ed} \sum_\tau y_\tau E_\tau |\psi_{ed}\rangle \qquad \text{(Eq. 18)}$$

$$= \sum_\tau y_\tau (Q_{en} \hat{U} Q_{en}^\dagger)(Q_{en}(-i)^{\zeta \cdot \tau} \mathbb{S}_\tau^{\zeta} \otimes \mathbb{S}_\tau Q_{en}^\dagger) Q_{en}|0\rangle \otimes |\psi_{ed}\rangle$$

$$= Q_{en} \sum_\tau y_\tau \hat{U} (-i)^{\zeta \cdot \tau} \mathbb{S}_\tau^{\zeta} \otimes \mathbb{S}_\tau Q_{en}|0\rangle \otimes |\psi_{ed}\rangle$$

$$= Q_{en} \sum_\tau y_\tau (i)^{\zeta \cdot \tau} \Big\{|0\rangle\langle 0| \otimes M + \sum_{\alpha,\beta \in \mathbb{Z}_2^{n-k} - [0]} |\alpha\rangle$$
$$\langle \beta| \otimes [i^{\xi_{\alpha\beta} \cdot \alpha} (-i)^{\eta_\beta \cdot \beta} x_{\alpha\beta} S_\alpha M \mathbb{S}_\beta]\Big\} |\tau\rangle \otimes \mathbb{S}_\tau |\psi\rangle$$

$$= Q_{en} y_0 |0\rangle \otimes |\psi\rangle + \sum_{\alpha,\beta \in \mathbb{Z}_2^{n-k} - [0]}$$
$$\delta_{\beta\tau} y_\tau (i)^{\zeta \cdot \tau} i^{\xi_{\alpha\beta} \cdot \alpha} (-i)^{\eta_\beta \cdot \beta} x_{\alpha\beta} |\alpha\rangle \otimes S_\alpha M \mathbb{S}_\beta \mathbb{S}_\tau |\psi\rangle$$

$$= Q_{en} y_0 |0\rangle \otimes |\psi\rangle +$$
$$Q_{en} \sum_\alpha \sum_\beta y_\beta (i)^{\zeta \cdot \beta} i^{\xi_{\alpha\beta} \cdot \alpha} (-i)^{\eta_\beta \cdot \beta} x_{\alpha\beta} |\alpha\rangle \otimes S_\alpha M \mathbb{S}_\beta \mathbb{S}_\beta |\psi\rangle$$

$$= y_0 Q_{en} |0\rangle \otimes |\psi\rangle + \sum_\alpha z_\alpha Q_{en} |\alpha\rangle \otimes S_\alpha M |\psi\rangle.$$

The main result is therefore affirmed.

According to the present inventive concept, the fault tolerant encode obeys two criteria, wherein one of the criteria is eigen-invariance that every codeword state is still a codeword state after applying the encode, and the other one of the criteria is error-correctable that each corrupted state is a linear superposition of correctable states in $[n, k, C]$ after applying the encode.

In an embodiment of the present inventive concept, the first stabilizer $C$ is composed of $2^{n-k}$ n-qubit spinors, wherein the n-qubit spinors are able to commute with each other.

In an embodiment of the present inventive concept, the basis state operator $\Lambda$ is composed of a direct product by a single basis state projection operator and a k-qubit quantum gate M.

In an embodiment of the present inventive concept, the correction operator $\Omega$ is composed of $2^{\{2(n-k)\}}$ submatrices $M_{\alpha,\beta}$.

In the partition $[n, k, \hat{C}]$, an eigen-invariant action $\hat{U} = \Lambda + \Omega$ associated to a k-qubit action, the quantum gate $M_{0,0} \in SU(2^k)$, $\Lambda = |0\rangle\langle 0| \oplus M_{0,0}$ and $\Omega = \Sigma_{\alpha,\beta \in \mathbb{Z}_2^{n-k} - \{0\}} |\alpha\rangle \langle \beta| \oplus M_{\alpha,\beta}$, is error correctable if each $M_{\alpha,\beta} \in \mathbb{C}^{2^k \times 2^k}$ is of the form $$M_{\alpha,\beta} = i^{\xi_{\alpha\beta} \cdot \alpha} (-i)^{\eta_\beta \cdot \beta} x_{\alpha\beta} S_\alpha M_{0,0} \mathbb{S}_\beta,$$

wherein the k-qubit spinors $$\mathbb{S}_\beta = (-i)^{\varsigma_\beta \cdot \kappa_\beta} S_{\kappa_\beta}^{\varsigma_\beta} \text{ and } S_\alpha = (-i)^{\pi_\alpha \cdot \omega_\alpha} S_{\omega_\alpha}^{\pi_\alpha}$$

are respectively the input coset $\hat{\mathcal{W}}_{\beta,\mu(\beta)}$ of block $\hat{\Gamma}_\beta$ and the output coset $\hat{\mathcal{W}}_{\alpha,\nu(\alpha)}$ of block $\hat{\Gamma}_\alpha$, $\mu(\beta) = \varsigma_\beta \kappa_\beta$ and $\nu(\alpha) = \pi_\alpha \omega_\alpha$, the unitarity $\tilde{\mathcal{T}} \tilde{\mathcal{T}}^\dagger = I_{2^n - 2^k}$ and $\tilde{\mathcal{T}}^\dagger \tilde{\mathcal{T}} = I_{2^n - 2^k}$ holds for the transfer amplitude $\tilde{\mathcal{T}} = \Sigma_{\alpha,\beta \neq 0} i^{\xi_{\alpha\beta} \cdot \alpha} (-i)^{\eta_\beta \cdot \beta} x_{\alpha\beta} |\alpha\rangle \langle \beta| \oplus I_{2^k}$, $x_{\alpha\beta} \in \mathbb{C}$ and $\xi_{\alpha\beta}, \eta_\beta \in \mathbb{Z}_2^{n-k}$.

In an embodiment of the present inventive concept, the correction operator $\Omega$ is obtained by a method, including:

transforming each correctable error $E_\tau$ of a correctable error set $\varepsilon$ by the encoding $Q_{en}$ to a coset of error of each correctable error $E_\xi$ in the second stabilizer $\hat{C}$ in the intrinsic coordinate, wherein the coset of error is a k-qubit spinor $\mathbb{S}_\tau$;

building a first complete set $P_{in}$ in the second stabilizer $\hat{C}$ in the intrinsic coordinate, wherein the first complete set $P_{in}$ is consisting of a unique input coset $\mathbb{S}_\beta$ solely chosen from every block $\Gamma_\alpha$, and the first complete set $P_{in}$ contains all the spinors $\mathbb{S}_\tau$;

building a second complete set $P_{out}$ in the second stabilizer $\hat{C}$ in the intrinsic coordinate, wherein the second complete set $P_{out}$ is consisting of a unique output coset $\mathbb{S}_\alpha$ solely chosen from every block $\Gamma_\alpha$;

formulating a transfer amplitude T; and wherein each of the submatrices $M_{\alpha\beta}$ of the encoding $Q_{en}$ represents as a sequential product by $x_{\alpha\beta}$, the output coset $\mathbb{S}_\alpha$, the k-qubit quantum gate M and the input coset $\mathbb{S}_\beta$.

In an embodiment of the present inventive concept, wherein the transfer amplitude T is a $2^n \times 2^n$ unitary matrix.

In an embodiment of the present inventive concept, the entry $x_{\alpha\beta}$ of the unitary matrix fulfills a relation which is $x_{0\beta} = x_{\alpha 0} = 0$.

For the partition $[n, k, C]$ generated by a bi-subalgebra $C \subset su(2^n)$ against an error set $\varepsilon$, there exist multiple choices of fault tolerant encodes for every action of k qubits.

Given $[n, k, C]$, the adjoint of the encoding $Q_{en}^\dagger \in SU(2^n)$ transforms each error $E^{(\tau)} \in \Gamma_\tau$ of $\varepsilon$ to a spinor $S^{(\tau)} = Q_{en}^\dagger E^{(\tau)} Q_{en} = (-i)^{n_\tau \cdot \tau} \mathbb{S}_\tau^{\eta_\tau} \oplus \tilde{\mathbb{S}}_\tau$ of a coset of errors $\hat{\mathcal{W}}_{\tau,\vartheta} \subset \hat{\Gamma}_\tau$ in $[n, k, \hat{C}]$ of the intrinsic coordinate, $\vartheta = \varsigma_\tau \omega_\tau$ and the part of k qubits $\psi_\tau = (-i)^{\varsigma_\tau \cdot \omega_\tau} S_{\omega_\tau}^{\varsigma_\tau}$.

Let the fault tolerant operation $\hat{U} = \Lambda + \Omega$ be prepared for a k-qubit action $M_{0,0} \in SU(2^k)$ in the intrinsic coordinate, here $\Lambda = |0\rangle\langle 0| \oplus M_{0,0}$ and $\Omega = \Sigma_{\alpha,\beta \neq 0} |\alpha\rangle \langle \beta| \oplus (-i)^{\eta_\beta \cdot \beta} x_{\alpha\beta} S_\alpha M_{0,0} \mathbb{S}_\beta$, and $\mathbb{S}_\beta$ being the input coset $\hat{\mathcal{W}}_{\beta,\mu(\beta)} \in \mathcal{P}_{in}$ of block $\hat{\Gamma}_\beta$ and $S_\alpha$ the output coset $\hat{\mathcal{W}}_{\alpha,\nu(\alpha)} \in \mathcal{P}_{out}$ of block $\hat{\Gamma}_\alpha$. As a must, the next is to identify the input coset with the coset of errors $\hat{\mathcal{W}}_{\beta,\mu(\beta)}=\hat{\mathcal{W}}_{\tau,\vartheta}$ in every same block $\hat{\Gamma}_\beta=\tau$, i.e., $\mathbb{S}_\beta=\mathbb{S}_\tau$ if $\beta=\tau$. Then, by mapping $\hat{U}$ into $U=Q_{en}\hat{U}Q_{en}^\dagger$, a fault tolerant encode U of $M_{0,0}$ in [n, k, C] is delivered, accompanied with a set of correction operators $\{S_{\alpha,\nu(\alpha)} \in \mathcal{W}_{\alpha,\nu(\alpha)}: \alpha \in Z_2^{n-k}\}$ individually from each output coset $\mathcal{W}_{\alpha,\nu(\alpha)}=Q_{en}\hat{\mathcal{W}}_{\alpha,\nu(\alpha)}Q_{en}^\dagger$.

Multiple choices of fault tolerant encodes for a k-qubit action in [n, k, C] lie in great freedom of constructing the encoding $Q_{en}$ and the correction operatior $\Omega$. A huge number of versions of $Q_{en}$ spring from rich options of selecting ordered sets of n–k independent spinors from C. All bi-subalgebras sized the same as C are acquirable via exhaustive spinor-to-spinor mappings, amounting to a combinatorially gigantic number of partitions given n and k. Beware the intractable complexity to further determine admissible partitions correcting an error set. The diversified design of $\Omega$ stems from numerous designations of cosets for the two complete sets $\mathcal{P}_{in}$ and $\mathcal{P}_{out}$ and from the extensive weaving of transfer amplitude $\hat{\mathcal{J}}$. Cost deviations, resulting from differences in $Q_{en}$ and $\Omega$, escalate when the computation scaling up.

No confined to stabilizer codes, the methodology of creating fault tolerant encodes is also applicable to nonadditive codes. In respect of a partition [n, k, C; t] correcting t-errors, the gap n–k can be arbitrarily squeezed with increasing n and k given mildly rising t, namely the rate $$R = \frac{k}{n} \to 1$$

for very large n and k given t. In corporation with versatile selections of quantum gates in accord with constraints and advantages of implementations in practice, it is algorithmically achievable to attain optimized compositions of actions for every computation. Synthesizing the two elements paves the way to an Initiative of optimizing scalable fault tolerance quantum computation. The assertion of conclusion may be the beginning of new adventures.

Every action admits fault tolerance in every code.

The present inventive concept provides a method for constructing an n-qubit fault tolerant encode for any k-qubit quantum gate, M, in any given quantum code [n, k, C]. That is, being the quantum extension of a classical Hamming code [n, k], a quantum code [n, k, C] is literally a QAP consisting of cosets of the first stabilizer C under two bitwise additions of n-digit binary strings. Within this structure, it is easy to locate each correctable error in a unique partition unit, i.e., a coset. Resorting to this illustrative structure, every quantum code [n, k, C] admits an algorithmic construction of fault tolerant encodes of a number n of physical qubits for every action, i.e., a quantum gate, of k logical qubits. Current building of fault tolerant encodes is restricted to very few quantum gates in very limited choices of codes, specifically, the Hadamard gate and the controlled-not gate in the Steane code and the $$\frac{\pi}{8} - \text{gate}$$

in the Reed-Muller code. This fact induces a high overhead in at least the ratio 105 :1 of physical qubits to logical qubits, which is setting a formidable obstacle to scalable quantum computation. While, this ratio is drastically reduced to 1:1, with increasing n and k, in the present inventive concept.

The foregoing descriptions of the detailed embodiments are only illustrated to disclose the features and functions of the present inventive concept and not restrictive of the scope of the present inventive concept. It should be understood to those in the art that all modifications and variations according to the spirit and principle in the disclosure of the present inventive concept should fall within the scope of the appended claims.

What is claimed is:

1. A computer-implemented method for constructing a fault tolerant encode using a quantum computational model at a hardware level, where the fault tolerant encode is an n-qubit fault tolerant encode for any k-qubit quantum gate, M, in any given quantum code [n, k, C], wherein
   the C is defined as a first stabilizer which is a k-th maximal bi-subalgebra;
   the quantum code [n, k, C] is consisting of a number $2^{n-k}$ of cosets of the first stabilizer C and the quantum code is a Quotient Algebra Partition (QAP);
   the cosets of the first stabilizer C is able to group into a number $2^{n-k}$ of blocks $\Gamma_\alpha$, wherein each of the blocks $\Gamma_\alpha$ consists of $2^{2k}$ cosets of the first stabilizer C with same syndrome $\alpha$; and
   the quantum code [n, k, C] is used for detecting and correcting chosen errors from different blocks $\Gamma_\alpha$, and the errors are collected as an error set $\varepsilon$, and wherein the method comprises:
   (1) choosing a number n–k of independent spinors $S_r$ from the first stabilizer C and a first ordered set $S_C$ consists of the independent spinors $S_r$;
   (2) choosing a number n–k of independent spinors $\hat{S}_r$ in a second stabilizer $\hat{C}$ in the intrinsic coordinate and a second ordered set $S_{\hat{C}}$ consists of the independent spinors $\hat{S}_r$ in the intrinsic coordinate;
   (3) implementing an encoding $Q_{en}$, wherein the encoding $Q_{en}$ converts the first ordered set $S_C$ to the second ordered set $S_{\hat{C}}$, and transforms the first stabilizer C to the second stabilizer $\hat{C}$ in the intrinsic coordinate wherein the code [n, k, C] is converted to [n, k, $\hat{C}$] in the intrinsic coordinate; wherein the encoding $Q_{en}$ is a sequential product provided by sequential operations of a number n–k of unitary operators $Q_r$; wherein each of the unitary operator $Q_r$ is composed of a single s-rotation or a product of two s-rotations; and wherein the encoding $Q_{en}$ converts and maps the $r^{th}$ independent spinor $S_r$ in the first ordered set $S_C$ to the $r^{th}$ independent spinor $\hat{S}_r$ in the second ordered set $S_{\hat{C}}$ correspondingly;
   (4) a fault tolerant action $\hat{U}$ in the quantum code [n, k, C] generated by the second stabilizer $\hat{C}$ in the intrinsic coordinate, wherein the fault tolerant action $\hat{U}$ is a direct sum of a basis state operator $\Lambda$ and a correction operator $\Omega$; and
   (5) acquiring a fault tolerant encode in the quantum code [n, k, C] generated by the first stabilizer C, wherein the fault tolerant encode is a sequential product of the encoding $Q_{en}$, the fault tolerant action $\hat{U}$ and a complex conjugate $Q_{en}^\dagger$ of the encoding $Q_{en}$, and
   wherein the fault tolerant encode obeys two criteria, wherein one of the criteria is eigen-invariance that every codeword state is still a codeword after applying the encode, and the other one of the criteria is error-correctable that each corrupted state is a linear superposition of correctable states in [n, k, C] after applying the encode.

2. The method of claim 1, wherein the first stabilizer C is composed of $2^{n-k}$ n-qubit spinors, wherein the n-qubit spinors are able to commute with each other.

3. The method of claim 1, wherein the basis state operator $\Lambda$ is composed of a direct product by a single basis state projection operator and a k-qubit quantum gate M.

4. The method of claim 1, wherein the correction operator $\Omega$ is composed of $2^{\{2(n-k)\}}$ submatrices $M_{\alpha\beta}$.

5. The method of claim 4, the correction operator $\Omega$ is obtained by a method, including:
transforming each correctable error $E_\tau$ of a correctable error set $\varepsilon$ by the encoding $Q_{en}$ to a coset of error of each correctable error $E_\tau$ in the second stabilizer $\hat{C}$ in the intrinsic coordinate, wherein the coset of error is a k-qubit spinor $\mathbb{S}_\tau$;
building a first complete set $P_{in}$ in the second stabilizer $\hat{C}$ in the intrinsic coordinate, wherein the first complete set $P_{in}$ is consisting of a unique input coset $\mathbb{S}_\beta$ solely chosen from every block $\Gamma_\alpha$, and the first complete set $P_{in}$ contains all the spinors $\mathbb{S}_\tau$;
building a second complete set $P_{out}$ in the second stabilizer $\hat{C}$ in the intrinsic coordinate, wherein the second complete set $P_{out}$ is consisting of a unique output coset $\mathbb{S}_\alpha$ solely chosen from every block $\Gamma_\alpha$;
formulating a transfer amplitude T; and
wherein each of the submatrices $M_{\alpha\beta}$ of the encoding $Q_{en}$ represents as a sequential product by entries of the submatrices $M_{\alpha\beta}$ ($x_{\alpha\beta}$), the output coset $\mathbb{S}_\alpha$, the K-qubit quantum gate M and the input coset $\mathbb{S}_\beta$.

6. The method of claim 5, wherein the transfer amplitude T is a $2^n \times 2^n$ unitary matrix.

7. The method of claim 5, wherein the entries $x_{\alpha\beta}$ of the unitary matrix fulfills a relation which is $x_{0\beta}=x_{\alpha 0}=0$.

* * * * *